United States Patent [19]

Keil et al.

[11] Patent Number: 5,541,442
[45] Date of Patent: Jul. 30, 1996

[54] INTEGRATED COMPACT CAPACITOR-RESISTOR/INDUCTOR CONFIGURATION

[75] Inventors: Richard F. Keil, Jonesville; Ram Kelkar, South Burlington; Ilya I. Novof, Essex Junction; Jeffery H. Oppold, Richmond; Kenneth D. Short, Essex Junction; Stephen D. Wyatt, Jericho, all of Vt.

[73] Assignee: International Business Machines Corporation, Armonk, N.Y.

[21] Appl. No.: 298,685

[22] Filed: Aug. 31, 1994

[51] Int. Cl.⁶ .................................................. H01L 29/00
[52] U.S. Cl. .......................... 257/533; 257/531; 257/532; 257/536; 257/538
[58] Field of Search .................................. 257/358, 359, 257/360, 363, 379, 380, 381, 516, 528, 531, 533, 537, 538, 541, 532, 536

[56] References Cited

U.S. PATENT DOCUMENTS

| | | | |
|---|---|---|---|
| 3,193,740 | 7/1965 | Osafune et al. | |
| 3,644,850 | 2/1972 | Ho | 333/302 |
| 3,864,817 | 2/1975 | Lapham, Jr. et al. | 437/54 |
| 4,251,326 | 2/1981 | Arcidiacono et al. | 205/125 |
| 4,258,001 | 8/1981 | Gerzberg et al. | 257/300 |
| 4,419,812 | 12/1983 | Topich | 437/47 |
| 4,458,295 | 7/1984 | Durschlag et al. | 361/322 |
| 4,560,963 | 12/1985 | Sharpe | 333/172 |
| 4,853,759 | 8/1989 | Haque | 257/533 |
| 4,866,502 | 9/1989 | Tomaszewski et al. | 257/533 |
| 4,910,516 | 3/1990 | Krenik | 341/118 |
| 5,189,593 | 2/1993 | Ooi | 455/195.1 |
| 5,196,723 | 3/1993 | Andersson et al. | 257/538 |
| 5,254,493 | 10/1993 | Kumar | 437/60 |
| 5,283,462 | 2/1994 | Stengel | 257/595 |
| 5,416,356 | 5/1995 | Staudinger et al. | 257/531 |

FOREIGN PATENT DOCUMENTS

| | | | |
|---|---|---|---|
| 57-169267 | 10/1982 | Japan | 257/538 |
| 1-278771 | 11/1989 | Japan | 257/360 |
| 4-147671 | 5/1992 | Japan | 257/379 |
| 5-82736 | 4/1993 | Japan | 257/531 |

OTHER PUBLICATIONS

Gregorian et al. *Analog MOS Integrated Circuits for Signal Processing*, 1986, pp. 78–97.
Reinhard, *Introduction to Integrated Circuit Engineering*, 1987, pp. 188–199.

*Primary Examiner*—Sara W. Crane
*Assistant Examiner*—Alice W. Tang
*Attorney, Agent, or Firm*—Calfee, Halter & Griswold

[57] ABSTRACT

An improved configuration of a capacitor formed with FET technology and a resistor and/or conductor is provided. In this configuration a capacitor is formed in which the diffusion zone of the substrate is used as one plate of the capacitor and what would normally be the gate electrode of an FET is used as the other plate of the capacitor, with the two plates being separated by a conventional thin dielectric gate oxide layer. An insulator, such as silicon dioxide overlays the gate electrode, and electrical connections to the gate electrode and diffusion zone are made through the insulator to allow the two plates of the capacitor to be connected to various devices or components as required. The top surface of this insulation layer is also used to form metal resistors. Depending on the value of required resistance, a second insulating layer may be used and a second level of metal used to connect segments of the resistors formed on the first layer of metal to form a longer resistor. This second layer of metal may also be used to form inductors. Moreover both inductors and resistors can be formed; however this may require a third layer of metal for connection purposes.

8 Claims, 3 Drawing Sheets

INTEGRATED COMPACT CAPACITOR-RESISTOR/INDUCTOR CONFIGURATION

BACKGROUND OF THE INVENTION

1. Field of the Invention

This invention relates generally to the integrated structure and configuration of capacitors, together with resistors and/or inductors, and more particularly to an improved structure and arrangement of capacitors, together with resistors and/or inductors formed on semiconductor substrates using digital CMOS semiconductor processing techniques.

2. Background Art

In the formation of integrated circuits on semiconductor substrates, such as in the manufacture of microprocessors and ASIC (Application Specific Integrated circuit) chips, various devices and circuit components are formed and connected by surface or internal wiring to form desired circuits. Among the components that are formed are capacitors and resistors. These components are used in many different circuits in many different ways. However, as device sizes and the circuit sizes decrease, and the number of devices that can be formed on the various substrates increases it is increasingly difficult to retain enough surface area or "real estate" to form resistors or inductors, or other similar type components, which take up relatively large areas, as opposed to the areas required for the logic devices such as transistors, diodes, and the like. Moreover, formation of capacitors using essentially FET (field effect transistor) technology utilizes a substantial amount of surface area or "real estate".

Thus it would be desirable to be able to use FET technology to form capacitors and also form resistors and/or inductors using a minimum of surface area or "real estate" in the final product. For high frequency applications, the capacitor is segmented into multiple polysilicon strips. In this case, FET channel length is reduced; therefore, FET channel resistance is reduced, and thus the segmented capacitor time constant is reduced.

SUMMARY OF THE INVENTION

According to the present invention an improved configuration of a capacitor formed with FET technology and a resistor and/or inductor is provided which utilizes a minimum of surface area of the semiconductor substrate. In this configuration a capacitor is formed in which the diffusion zone of the substrate is used as one plate of the capacitor and what would normally be the gate electrode of an FET is used as the other plate of the capacitor, with the two plates being separated by a conventional thin dielectric gate oxide layer. An insulator, such as silicon dioxide overlays the gate electrode, and electrical connections to the gate electrode and diffusion zone are made through the insulator to allow the two plates of the capacitor to be connected to various devices or components as required. These connections on top of the insulating layer are referred to as a first metallization layer. The top surface of this insulation layer is also used to form metal resistors. Depending on the value of required resistance a second insulating layer may be used and a second level of metal used to connect segments of the resistors formed on the first layer of metal to form a longer resistor. This second layer of metal may also be used to form inductors. Moreover both inductors and resistors can be formed; however this may require a third layer of metal for connection purposes.

DESCRIPTION OF THE PREFERRED EMBODIMENTS

Figure 1:
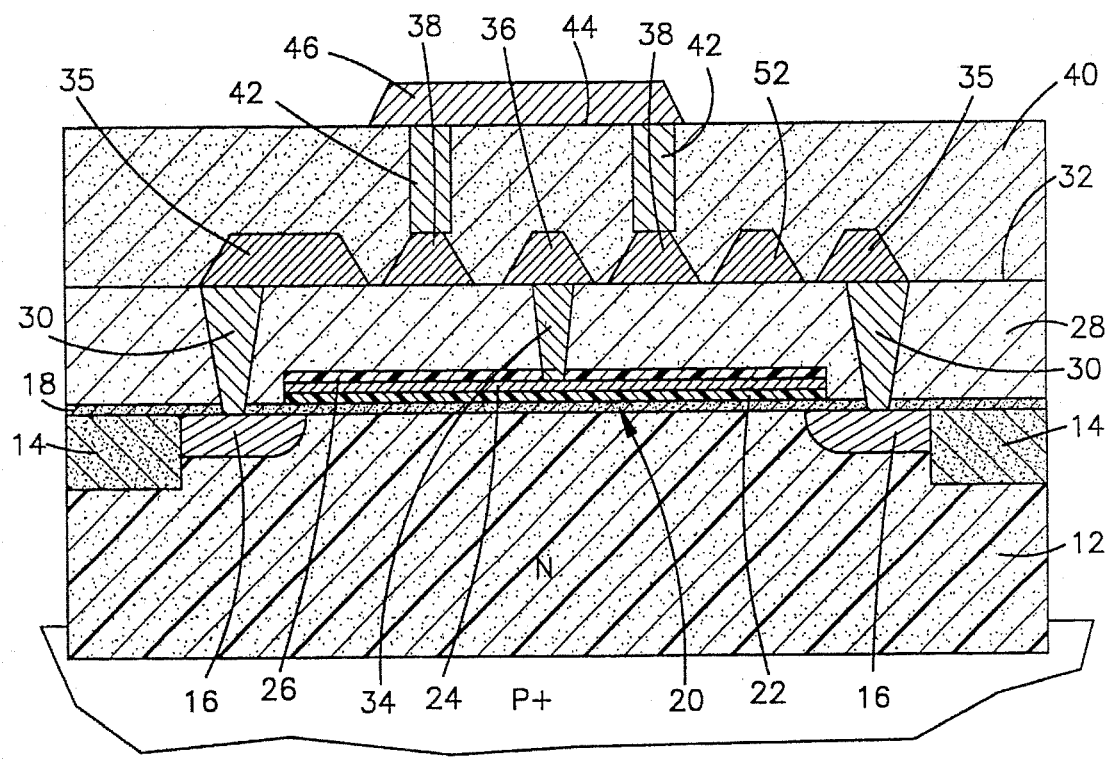
FIG. 1 is a longitudinal sectional view somewhat schematic and with certain elements rearranged for clarity of illustration of a portion of a semiconductor chip having capacitor and resistor formed thereon according to this invention.
Figure 2:
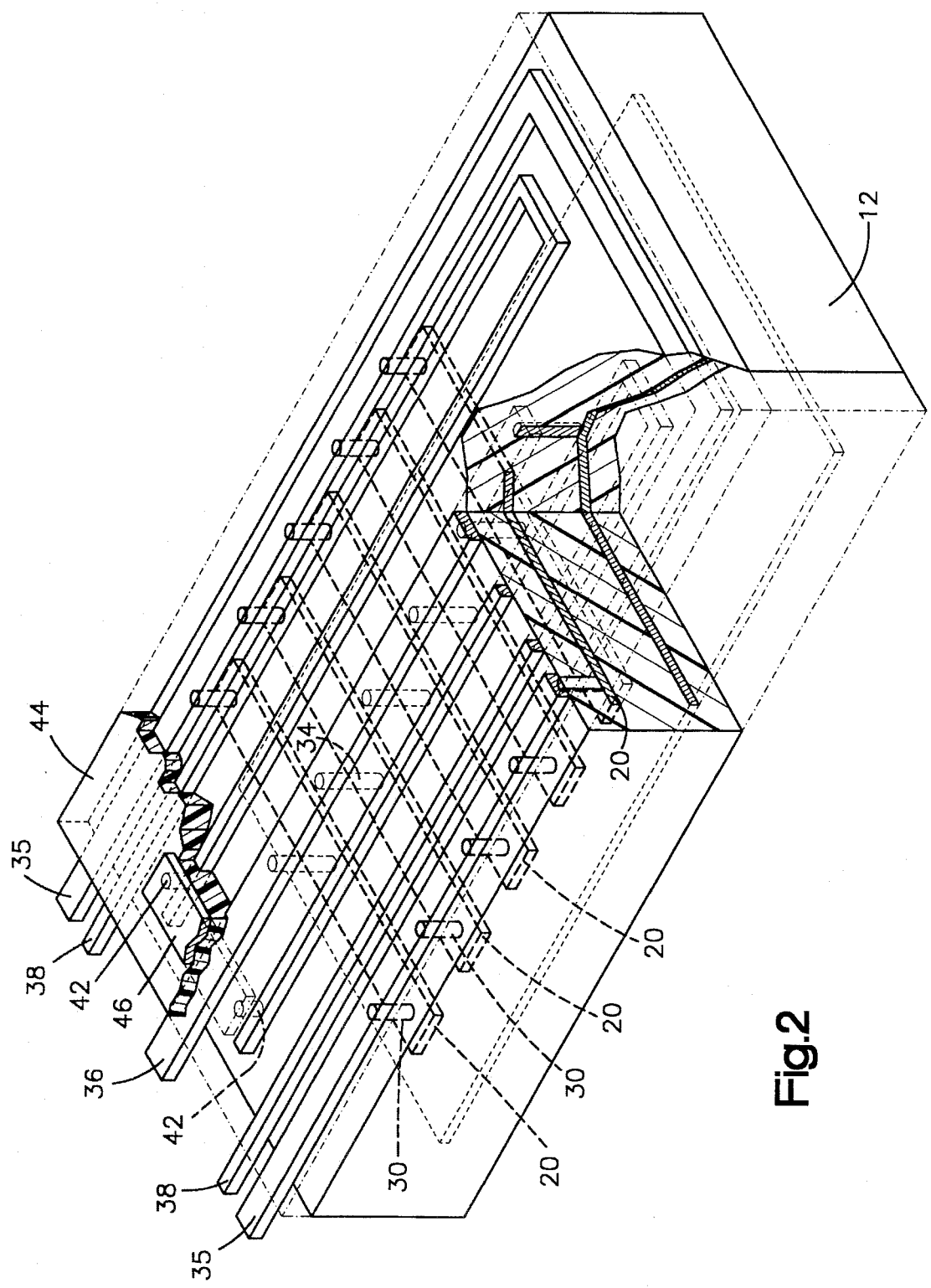
FIG. 2 is a perspective view, partially in section and somewhat schematic with parts broken away for clarity of a portion of the capacitor and resistor structure of this invention.

Referring now to the drawings, and for the present to FIGS. 1 and 2, one embodiment of the present invention is shown. The basic structure is formed using conventional CMOS technology for forming FETs and other devices on silicon wafer substrates. Hence terminology common to such technology will be used to describe the structure and processing steps.

The processing steps included the conventional steps of using photolithography together with ion implanting, metal deposition and etching to form the various layers. These techniques are well known in the art and hence need not be described in detail.

A conventional silicon wafer 10 of P+ material is used as starting material. An N well 12 is formed therein using ion implanting which well is about 1 micron deep. Recessed oxide 14 surrounds the N well 12. An N+ diffusion zone 16 is formed in the N well 12, also by ion implanting, adjacent to the recessed oxide 14. This N+ diffusion zone typically is about 0.3 microns deep. Over this substrate is a thin layer of a gate oxide 18, e.g., grown silicon dioxide, typically about 135 angstroms thick. On top of the gate oxide 18 a gate electrode structure 20 is formed. It is to be understood that the term gate electrode or gate electrode structure refers to this structure 20 which in FET technology would be a gate electrode, but in the present invention it does not function as a FET gate but rather as a plate of a capacitor as will be described presently. Similarly, the term "gate oxide" is used to describe the oxide 18 which will operate similarly to the oxide for a gate electrode in that when a positive charge is applied to the plate structure 20, it is thin enough that electrons will be attracted to the surface of the N well 12, thus increasing the value of the capacitor formed.

The gate electrode structure 20 typically is a tri-layer structure comprised of a layer of polysilicon 22, a layer of tungsten silicide 24 and a thin layer of an insulator 26 such as silicon dioxide. The gate electrode structure 20 is about 0.5 microns thick. Overlying the gate oxide 18 and the gate electrode structure 20 is a relatively thick layer of silicon dioxide 28, i.e. about 1.0 micron thick. The method of forming this type of "gate" structure is well known in the art.

Metal connectors 30, e.g. tungsten, extend through the insulation from the top surface 32 of the insulator 28 and through the gate oxide 18 to the N+ diffusion layer 16; and connectors 34, e.g. tungsten, extend from the top surface 32 of the insulator 28 and through insulator 26 on top of gate electrode 20 into contact with the tungsten silicide layer 24 of the gate electrode 20. This structure thereby forms a capacitor with the gate electrode 20 as the positive plate and the N well material 12 as the other plate. The plates are separated by gate oxide insulator 18 and will operate as a capacitor as previously described, and as will be apparent to those skilled in the art.

Metallization to perform various functions is formed on the surface 32 of the insulator 28. This metalization typically is aluminum or an aluminum alloy or composite. Metal line 36 on the surface 32 of the oxide 28 forms the connection to the plate formed by gate electrodes 20 and metal line 35 forms the connection to N well plate 12 through N diffusion zone 16. FIG. 1 depicts a single gate and surrounding diffusion structure. FIG. 2 shows how several gate structures and surrounding diffusions are interconnected to obtain the desired capacitor value.

Also formed on the top surface of 32 of the oxide 28 is a series of U shaped resistors or elements 38 between metallization lines 35 and 36. If each of the U-shaped resistor elements 38 is long enough, and the proper size and metal for the resistor elements is selected, the connections to the resistor elements 38 may be made at this level using additional metallization on the surface 32 of the insulator 28.

If the length of the resistor needs to be longer than any one of the resistor elements 38 then two or more the resistor elements 38 need to be connected together. This is achieved by providing another layer of metallization which is accomplished by adding another layer of insulating material 40, e.g. silicon dioxide, and forming connectors 42 through the insulating material 40 from the top surface 44 thereof to the ends of two of the resistor elements 38. These connectors 42 are connected by metal straps 46 formed of aluminum, aluminum alloy or aluminum composite or other suitable metal. Thereby, a multilayer serpentine-shaped resistor is formed.

As can be seen, by forming resistor elements of metal on top of a capacitor formed using FET technology, no additional surface area or "real estate" is used for the resistors, since they are stacked on top of the capacitors.

Figure 3:
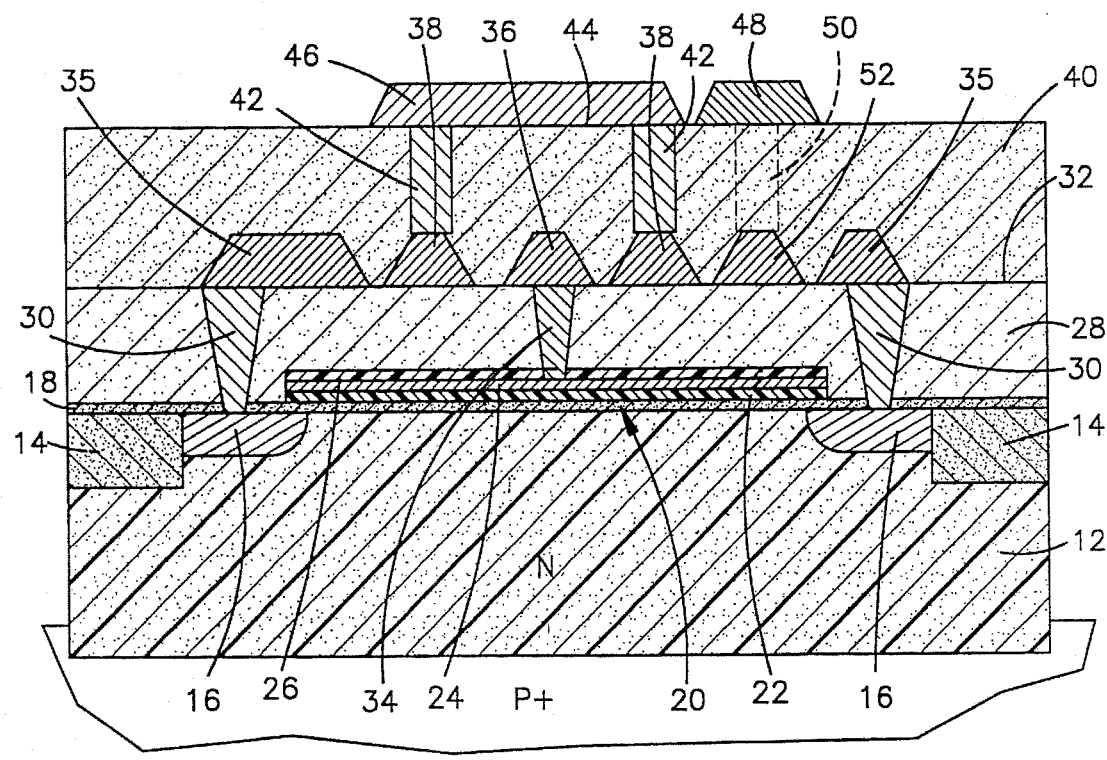
FIG. 3 is a sectional view similar to FIG. 2 showing an inductor formed on the second level of metallization.
Figure 4:
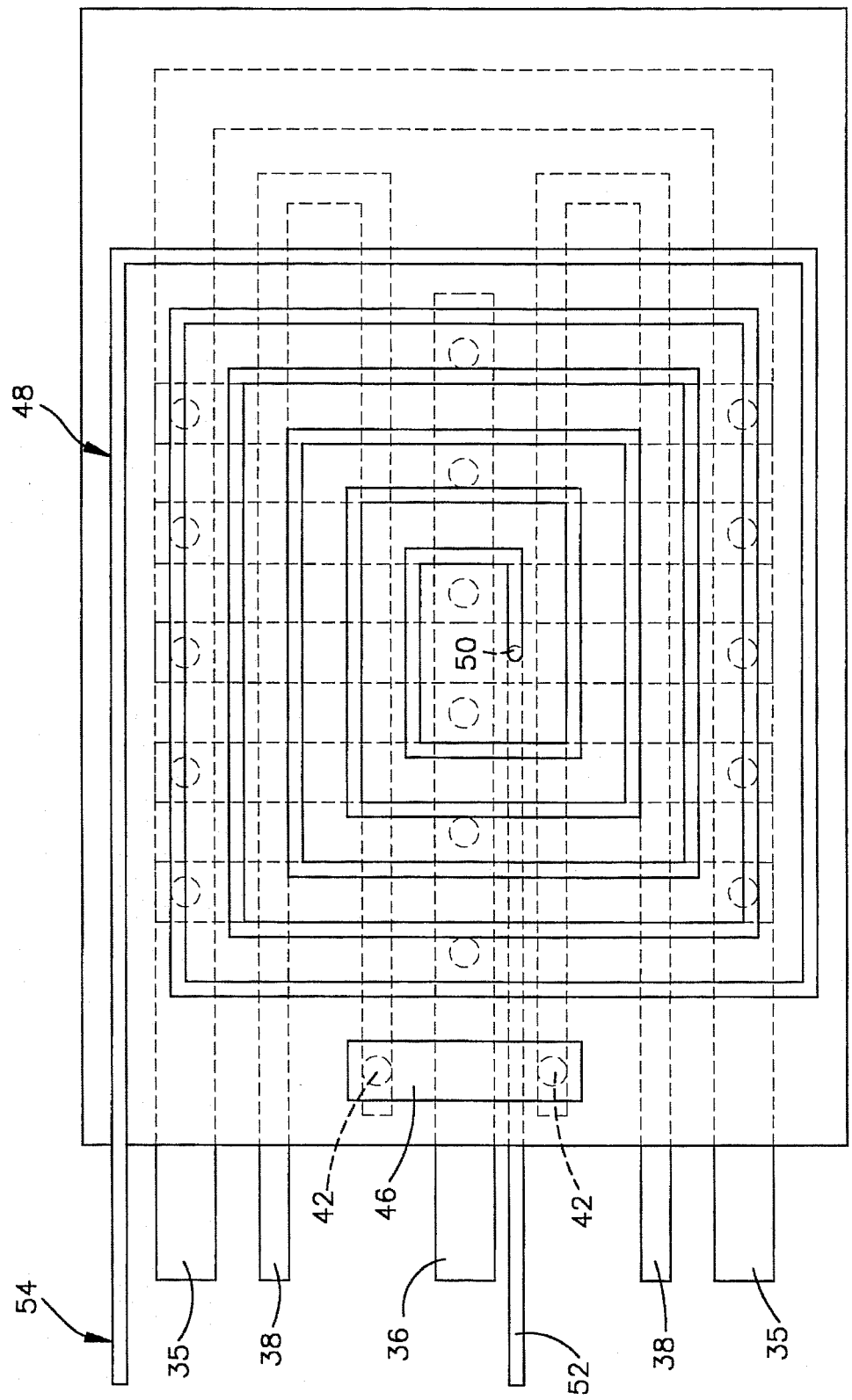
FIG. 4 is a plan view of the structure of FIG. 3.

FIGS. 3 and 4 show how an inductor can be formed on the second layer of metallization on the top surface 44 of the insulating material 40. The inductor takes the form of a coil of metal 48 deposited on the top surface 44 of the insulator 40 at a location spaced from the straps 46. An electrical conductor 50 extends through insulator 40 and connects an end of the inductor 48 to a metal conductor 52 formed on the surface 32 of oxide layer 28 and extending therefrom. The other end of the inductor 48 has an arm 54 extending therefrom which together with the conductor 52 constitutes connection to each end of the inductor.

If, however, there is insufficient area available on the surface 44 of insulator 40 for this conductor, a third level of metallization can be used. To accomplish this another layer of an insulator is deposited over the top of the insulator 40 by conventional means. The surface is then planarized. The inductor or a resistor can then be formed on to of this third layer of insulating material by conventional means. This would provide yet another level of metal circuit elements without using up any more surface area of the semiconductor chip 10.

The invention has been described in conjunction with CMOS technology using N wells with N+ implants and polysilicon gates. It is to be understood, however, that other technologies could be used. For example, P wells rather than the N wells could be used. Of course, the polarity of the capacitor plates would have to be changed. Moreover, gate structures other than polysilicon can be used, it only being necessary that the gate be a conducting material. Indeed, other semiconductor substrates can be used. The critical feature of this invention is the placement of a metal resistor or inductor or other similar structure on top of a capacitor formed on a semiconductor substrate using integrated circuit technology.

With this technique the capacitors, resistors, and inductors are independently formed, and are electrically insulated from each other and not interrelated. Hence, they may be used in different circuits on the same chip if desired.

Although several embodiments of this invention have been shown and described, various adaptations and modifications can be made without departing from the scope of the invention as defined in the appended claims.

What is claimed:

1. An integrated circuit structure comprising: a semiconductor substrate, a capacitor having a first plate formed in said semiconductor substrate, and a second plate spaced therefrom and separated by a layer of dielectric material; said first plate comprising a plurality of diffusion zones; wherein said plurality of diffusion zones are separate from each other; said second plate in contact with said layer of dielectric material and said second plate comprising a plurality of second plate regions that are separate from each other and wherein said plurality of second plate regions and said plurality of diffusion zones are in a superposed relation to each other and are formed between said plurality of diffusion zones;

a layer of electrically insulating material overlaying said second plate, and having a metal receiving surface spaced from said second plate;

a first electrical connector extending from said metal receiving surface through said insulating material and contacting said second plate; a second electrical connector extending from said metal surface through said insulating material and contacting said first plate; said second electrical connector comprising a common metal line connecting said plurality of diffusion zones to thereby form a single diffusion region; said first electrical connector comprising a continuous layer and contacting said plurality of second plate regions and at least one metal circuit element selected from the group of resistors and inductors disposed on said metal receiving surface of said insulating material;

whereby the integrated circuit structure is formed of a capacitor with at least one electrically insulated metal circuit element formed thereon.

2. The structure as defined in claim 1, wherein there are a plurality of said capacitors and resistors formed on said substrate.

3. The structure as defined in claim 1, wherein a resistor is formed on said metal receiving surface.

4. The structure as defined in claim 3, wherein there are a plurality of resistors formed on said metal receiving surface.

5. The structure as defined in claim 3, wherein the resistor is a serpentine-shaped resistor.

6. The structure as defined in claim 4, wherein said resistors are generally of a planar U-shape.

7. The structure as defined in claim 4, further characterized by a second layer of electrically insulating material overlying said resistors and having a boundary surface, and connections disposed on the boundary surface of said second layer of electrically insulating material and extending therethrough interconnecting said resistors.

8. The structure as defined in claim 7, wherein an inductor is disposed on the surface of said second layer of electrically insulating material.

* * * * *